(12) United States Patent
Roussel

(10) Patent No.: US 11,921,246 B2
(45) Date of Patent: Mar. 5, 2024

(54) MEASUREMENT OF POROELASTIC PRESSURE RESPONSE

(71) Applicant: CONOCOPHILLIPS COMPANY, Houston, TX (US)

(72) Inventor: Nicolas Patrick Roussel, Houston, TX (US)

(73) Assignee: CONOCOPHILLIPS COMPANY, Houston, TX (US)

( * ) Notice: Subject to any disclaimer, the term of this patent is extended or adjusted under 35 U.S.C. 154(b) by 0 days.

(21) Appl. No.: 17/554,986

(22) Filed: Dec. 17, 2021

(65) Prior Publication Data

US 2022/0107434 A1    Apr. 7, 2022

Related U.S. Application Data

(63) Continuation of application No. 16/408,405, filed on May 9, 2019, now Pat. No. 11,209,558.

(60) Provisional application No. 62/669,065, filed on May 9, 2018, provisional application No. 62/669,077, filed on May 9, 2018.

(51) Int. Cl.
| | |
|---|---|
| *G01V 1/28* | (2006.01) |
| *E21B 43/26* | (2006.01) |
| *E21B 47/06* | (2012.01) |
| *E21B 49/00* | (2006.01) |
| *G01V 1/50* | (2006.01) |
| *G06F 30/20* | (2020.01) |

(52) U.S. Cl.
CPC .............. *G01V 1/282* (2013.01); *E21B 43/26* (2013.01); *E21B 47/06* (2013.01); *E21B 49/003* (2013.01); *E21B 49/008* (2013.01); *G01V 1/50* (2013.01); *G06F 30/20* (2020.01); *G01V 2210/6242* (2013.01); *G01V 2210/6244* (2013.01); *G01V 2210/6248* (2013.01)

(58) Field of Classification Search
CPC ...... E21B 48/008; E21B 43/26; E21B 34/142; E21B 34/10
See application file for complete search history.

(56) References Cited

U.S. PATENT DOCUMENTS

| | | | |
|---|---|---|---|
| 3,933,205 | A | 1/1976 | Kiel |
| 7,114,561 | B2 | 10/2006 | Vinegar et al. |
| | | (Continued) | |

FOREIGN PATENT DOCUMENTS

| | | |
|---|---|---|
| WO | 20050124395 A2 | 12/2005 |
| WO | 20160175844 A1 | 11/2016 |
| WO | 20160193733 A1 | 12/2016 |

OTHER PUBLICATIONS

International Search Report, PCT/US2019/031633 dated Jul. 25, 2019; 2 pgs.

(Continued)

*Primary Examiner* — Steven A Macdonald
(74) *Attorney, Agent, or Firm* — CONOCOPHILLIPS COMPANY

(57) ABSTRACT

Method for characterizing subterranean formation is described. One method involves injecting a fluid into an active well of the subterranean formation at a pressure sufficient to induce one or more hydraulic fractures. Measuring, via a pressure sensor, a poroelastic pressure response caused by inducing of the one or more hydraulic fractures. The pressure sensor is in at least partial hydraulic isolation with the one or more hydraulic fractures.

20 Claims, 9 Drawing Sheets

(56) References Cited

U.S. PATENT DOCUMENTS

| | | | |
|---|---|---|---|
| 7,272,973 | B2 | 9/2007 | Craig |
| 8,210,257 | B2 | 7/2012 | Disterhoft et al. |
| 8,733,444 | B2 | 5/2014 | East, Jr. et al. |
| 8,839,873 | B2 | 9/2014 | Johnson et al. |
| 9,988,895 | B2* | 6/2018 | Roussel .................. E21B 43/26 |
| 2003/0042016 | A1 | 3/2003 | Vinegar et al. |
| 2007/0079652 | A1 | 4/2007 | Craig |
| 2009/0090505 | A1 | 4/2009 | McDaniel et al. |
| 2010/0250216 | A1 | 9/2010 | Narr et al. |
| 2012/0152550 | A1 | 6/2012 | East, Jr. |
| 2012/0168180 | A1 | 7/2012 | Johnson et al. |
| 2012/0325462 | A1 | 12/2012 | Roussel et al. |
| 2013/0186688 | A1 | 7/2013 | Rasmus et al. |
| 2014/0034319 | A1* | 2/2014 | Surjaatmadja .......... E21B 34/10 |
| | | | 166/305.1 |
| 2014/0048270 | A1 | 2/2014 | Soliman et al. |
| 2014/0067353 | A1 | 3/2014 | Shelley et al. |
| 2014/0083681 | A1 | 3/2014 | Taylor |
| 2015/0176394 | A1* | 6/2015 | Roussel .................. E21B 47/06 |
| | | | 166/250.1 |
| 2016/0003020 | A1 | 1/2016 | Sharma |
| 2016/0115780 | A1* | 4/2016 | James .................. E21B 49/008 |
| | | | 73/152.51 |
| 2016/0196367 | A1 | 7/2016 | Petukhov |
| 2016/0201451 | A1* | 7/2016 | Godager ................. E21B 49/00 |
| | | | 73/152.51 |
| 2018/0148999 | A1 | 5/2018 | Roussel |
| 2018/0149000 | A1 | 5/2018 | Roussel |
| 2018/0209262 | A1* | 7/2018 | Roussel .................. E21B 43/26 |
| 2019/0024505 | A1* | 1/2019 | Coenen .................. E21B 47/06 |
| 2019/0128112 | A1* | 5/2019 | Spicer ..................... E21B 43/26 |
| 2019/0346579 | A1 | 11/2019 | Roussel et al. |

OTHER PUBLICATIONS

Roussel N.P., et al., Optimizing Fracture Spacing and Sequencing in Horizontal-Well Fracturing, SPE International Symposium and Exhibition on Formation Damage Control, SPE 127986, May 2011.

Gronseth M., Determination Of The Instantaneous Shut In Pressure From Hydraulic Fracturing Data And Its Reliability As A Measure Of The Minimum Principal Stress, American Rock Mechanics Association, 23rd US Symposium on Rock Mechanics, p. 183-189 (1982).

McLennan J.D & Roegiers J.C., How Instantaneous are Instantaneous Shut-In Pressures?, SPE 57th Annual Fall Technical Conference and Exhibition, SPE 11064, Sep. 1982.

Soliman, M.Y et al., Methods for Enhancing Far-Field Complexity in Fracturing Operations, SPE Annual Technical Conference and Exhibition, SPE 133380, Sep. 2010.

Song J.H et al., Preventing Mud Losses by Wellbore Strengthening, SPE Russian Oil and Gas Technical Conference and Exhibition, SPE 101593, Oct. 2006.

Rafiee M., et al., Hydraulic Fracturing Design and Optimization: A Modification to Zipper Frack, SPE Eastern Regional Meeting, SPE 159786, Oct. 2012.

Waters et al., Simultaneous Hydraulic Fracturing of Adjacent Horizontal Wells in the Woodford Shale, Hydraulic Fracturing Technology Conference, SPE 119635, Jan. 2009.

The International Search Report and the Written Opinion of the International Searching Authority of PCT/US2017/063360, dated Feb. 15, 2018.

Manchanda, R., and M. Sharma (2013), Time Dependent Fracture Interference Effects in Pad Wells, SPE 164534 presented at the SPE Unconventional Resource Conference, The Woodlands, Texas.

McClure, M., and D. Zoback (2013), Computational Investigation of Trends in Initial Shut-in Pressure during Multi-Stage Hydraulic Stimulation in the Barnett Shale, 47th US Rock Mechanics/Geomechanics Symposium held in San Francisco, California, ARMA 13-368.

Manchanda, R., N.P. Roussel, and M. Sharma (2012), Factors Influencing Fracture Trajectories and Fracturing Pressure Data in a Horizontal Completion, 46th US Rock Mechanics/Geomechanics Symposium held in Chicago, Illinois, ARMA 12-633.

Roussel, N.P., R. Manchanda, and M. Sharma (2012), Implications of Fracturing Pressure Data Recorded during a Horizontal Completion on Stage Spacing Design, SPE 152631 presented at the SPE Hydraulic Fracturing Technology Conference, The Woodlands, Texas.

Roussel, N.P., and M. Sharma (2011), Strategies to Minimize Frac Spacing and Stimulate Natural Fractures in Horizontal Completions, SPE 146104 presented at the SPE Annual Technical Conference and Exhibition, Denver, Colorado.

Vermylen, J., and M. Zoback (2011), Hydraulic Fracturing, Microseismic Magnitudes, and Stress Evolution in the Barnett Shale, Texas, USA, SPE 140507 presented at the SPE Hydraulic Fracturing Technology Conference, The Woodlands, Texas.

Soliman, M.Y., L. East, and D. Adams (2008), Geomechanics Aspects of Multiple Fracturing of Horizontal and Vertical Wells, SPE Drilling and Completions, 23(3), 217-228, SPE 86992-PA.

Far, et al., Interpretation of factures and stress anisotropy in Marcellus Shale using multicomponents seismic data, Interpreatation 2(2): SE 105-SE115, Apr. 2014.

Hayashi, et al., Interpreatation of Hydraulic Fracturing Shut-in Curves for Tectonic Stress Measurements, Int. J. Rock Mech. Min Sci & Geomech, Abstr. vol. 26, No. 6, pp. 477-482, 1989.

Paderin, et al., Multi-stage hydro-fracture trajectories: modelling by the SIE method, Procedia Materials Science vol. 3, 2014, pp. 1798-1803.

International Search Report for related case, App. No. PCT/US2017/63357, dated Feb. 15, 2018.

* cited by examiner

MEASUREMENT OF POROELASTIC PRESSURE RESPONSE

CROSS-REFERENCE TO RELATED APPLICATIONS

This application is a continuation application which claims benefit under 35 USC § 120 to U.S. application Ser. No. 16/408,405 filed May 9, 2019, entitled "Measurement of Poroelastic Pressure Response," which claims benefit under 35 USC § 119(e) to U.S. Provisional Application Ser. No. 62/669,077 filed May 9, 2018, entitled "Measurement of Poroelastic Pressure Response," which is incorporated herein in its entirety.

The present invention is related to similar subject matter of commonly assigned U.S. patent application Ser. No. 16/408,396 filed May 9, 2019, entitled "Ubiquitous Real-Time Fracture Monitoring," which claims benefit under 35 USC § 119(e) to U.S. Provisional Application Ser. No. 62/669,065 entitled "Ubiquitous Real-Time Fracture Monitoring" filed on May 9, 2018, which is hereby incorporated by reference.

FIELD OF THE INVENTION

The present invention relates generally to recovery of hydrocarbons from unconventional reservoirs. More particularly, but not by way of limitation, embodiments of the present invention include tools and methods for real-time monitoring of hydraulic fracture geometry by quickly interrogating and finding a match in a database of poroelastic pressure signatures.

BACKGROUND OF THE INVENTION

During hydraulic fracturing stimulation process, highly pressurized fluids are injected into a reservoir rock. Fractures are created when the pressurized fluids overcome breaking strength of the rock (i.e., fluid pressure exceeds in-situ stress). These induced fractures and fracture systems (network of fractures) can act as pathways through which oil and natural gas migrate en route to a borehole and eventually brought up to surface. Efficiently and accurately characterizing created fracture systems is important for optimizing hydraulic fracturing. Determination and evaluation of hydraulic fracture geometry can influence field development practices in a number of important ways such as, but not limited to, well spacing/placement design, infill well drilling and timing, and completion design.

More recently, fracturing of shale from horizontal wells to produce gas has become increasingly important. Horizontal wellbore may be formed to reach desired regions of a formation not readily accessible. When hydraulically fracturing horizontal wells, multiple stages (in some cases dozens of stages) of fracturing can occur in a single well. These fracture stages are implemented in a single well bore to increase production levels and provide effective drainage. In many cases, there can also be multiple wells per location.

There are several conventional techniques (e.g., microseismic imaging) for characterizing geometry, location, and complexity of hydraulic fractures. As an indirect method, microseismic imaging technique can suffer from a number of issues which limit its effectiveness. While microseismic imaging can capture shear failure of natural fractures activated during well stimulation, it is typically less effective at capturing tensile opening of hydraulic fractures itself. Moreover, there is considerable debate on interpretations of microseismic events as it relates to hydraulic fractures.

While our understanding of what hydraulic fractures look like in shale reservoirs has improved, data acquisition for most wells tend to be limited with little to no information for characterizing stimulated reservoir volume (SRV). Hence, completion and reservoir engineers are often left to rely on production performance over several months/years to optimize field design and evaluate effectiveness of a completion design. Thus, one of the key challenges in hydraulic fracturing is accelerating this learning process to improve well performance and recovery.

BRIEF SUMMARY OF THE DISCLOSURE

The present invention relates generally to recovery of hydrocarbons from unconventional reservoirs. More particularly, but not by way of limitation, embodiments of the present invention include tools and methods for real-time monitoring of hydraulic fracture geometry by characterizing main characteristics of poroelastic responses measured during hydraulic stimulation and quickly interrogating and finding a match in database of poroelastic pressure signatures.

The present invention can monitor evolution of reservoir stresses throughout lifetime of a field during hydraulic fracturing. Measuring and/or identifying favorable stress regimes can help maximize efficiency of multi-stage fracture treatments in shale plays.

One example of a method for characterizing a subterranean formation includes: a) injecting a fluid into an active well of the subterranean formation at a pressure sufficient to induce one or more hydraulic fractures; and b) measuring, via a pressure sensor, a poroelastic pressure response caused by inducing of the one or more hydraulic fractures, wherein the pressure sensor is in at least partial hydraulic isolation with the one or more hydraulic fractures.

Another example of a method for characterizing a subterranean formation includes: a) injecting a fluid into the subterranean formation to induce one or more hydraulic fractures; and b) measuring a poroelastic pressure response, via a pressure sensor, through a monitor well, wherein the poroelastic pressure response is caused by inducing of the one or more hydraulic fractures.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Figures 1A, 1B:
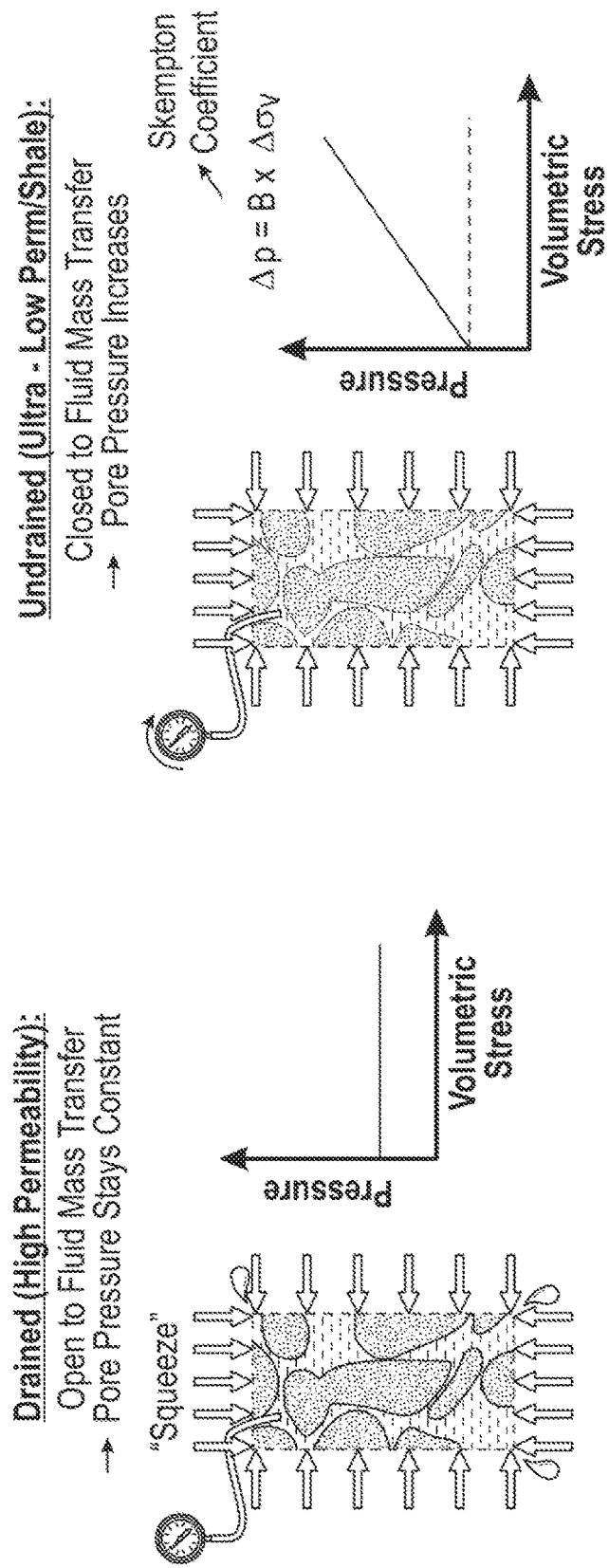
FIGS. 1A-1B illustrates poroelastic behavior in high permeability (FIG. 1A) and low permeability (FIG. 1B) systems.

Reference will now be made in detail to embodiments of the invention, one or more examples of which are illustrated in the accompanying drawings. Each example is provided by way of explanation of the invention, not as a limitation of the invention. It will be apparent to those skilled in the art that various modifications and variations can be made in the present invention without departing from the scope or spirit of the invention. For instance, features illustrated or described as part of one embodiment can be used on another embodiment to yield a still further embodiment. Thus, it is intended that the present invention cover such modifications and variations that come within the scope of the invention.

The present invention relates generally to recovery of hydrocarbons from unconventional reservoirs. More particularly, but not by way of limitation, embodiments of the present invention include tools and methods for real-time monitoring of hydraulic fracture geometry by quickly interrogating and finding a match in a database of poroelastic pressure signatures.

One of the goals of this technology is to enable cost effective characterization of the induced fracture system on virtually every well with little to no impact on ongoing operations. It has the potential to be used universally during fracturing operations in shale wells.

There are several advantages to the proposed invention. First is an ability to leverage knowledge from field pilots, instrumented wells and extend it to majority of wells for which there is limited data. Interpretations based on pressure data such as poroelastic response monitoring can be calibrated during pilot tests using number of methods including, but not limited to, distributed acoustic/temperature sensing (DAS/DTS), microseismic or tiltmeter monitoring, tracers, and then be applied in non-instrumented wells.

Another advantage capitalizes on the resulting quick speed of pressure data interpretation. For example, by training a neural network using synthetic cases of numerically-generated pressure response (for which induced-fracture characteristics are known), the present invention can quickly relate the measured poroelastic pressure response to fracture geometries and generate a real-time map. Other advantages will be apparent from the disclosure herein.

Poroelastic Pressure Response

During hydraulic stimulation, pressure data at active and offset wells (in multi-well pads) is easily available. However, this data is typically under-utilized. When correctly understood, this data reflects many physical phenomena beyond just momentum diffusion and includes tremendous information about the created SRV. At offset wells, many pressure changes can be seen during hydraulic fracturing operations. It is now known that many of them are poroelastic pressure responses where no fluid communication is being established between the active and offset wells. Instead, pressure changes are due to stresses imposed by dilated fractures ("squeezing" effect). These tensile dilations can alter reservoir stresses up to thousands of feet away from the fractures thus "squeezing" the surrounding rock. In high permeability systems, a fluid will be open to mass transfer so that pore pressure stays constant (FIG. 1A).

In low permeability systems (such as shale), the rock is closed to fluid mass transfer which causes the pore pressure to increase (FIG. 1B). One can measure the resulting poroelastic pressure response which can also be defined as a pressure change in the subsurface resulting from a change in volumetric stresses. A change in volumetric stress can be related back to a geomechanical phenomena. In other words, the poroelastic pressure response is a pressure signature that is not related to flow or hydraulic communication with the stimulated well but is a proxy for mechanical deformation and/or stress interference. An in-depth description of poroelastic pressure response and its use to characterize fractures is described in U.S. Publication US20150176394, the contents of which are hereby incorporated by reference.

Figure 2B:
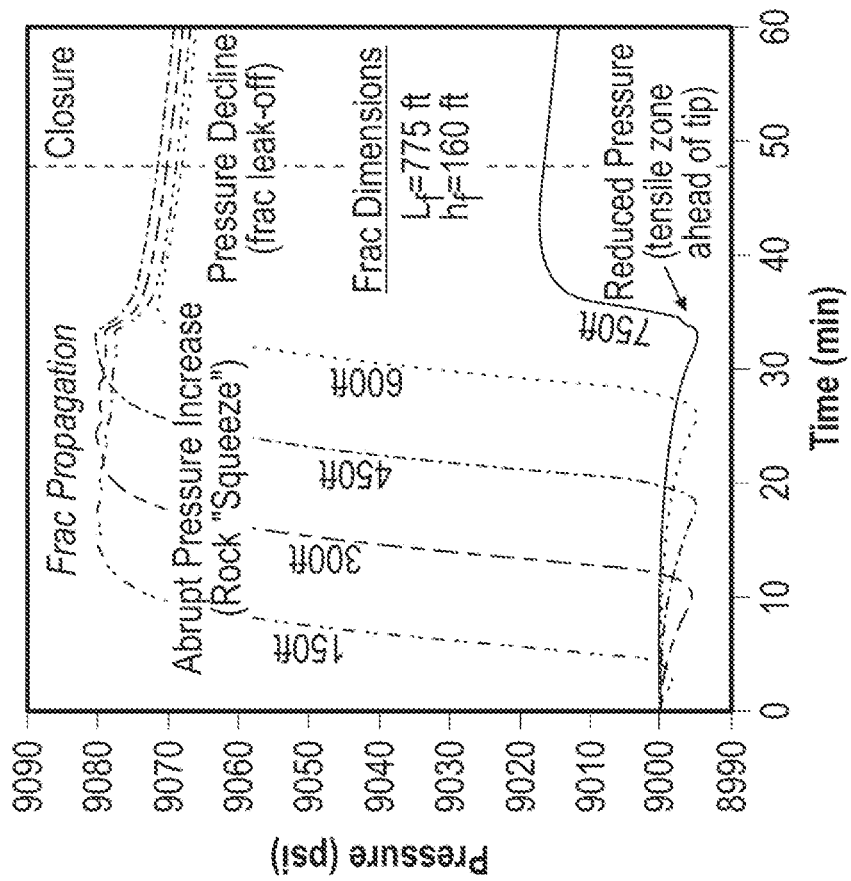
FIGS. 2A-2B illustrate a set simulated poroelastic pressure response curves of a known fracture geometry and observation points.
Figure 2A:
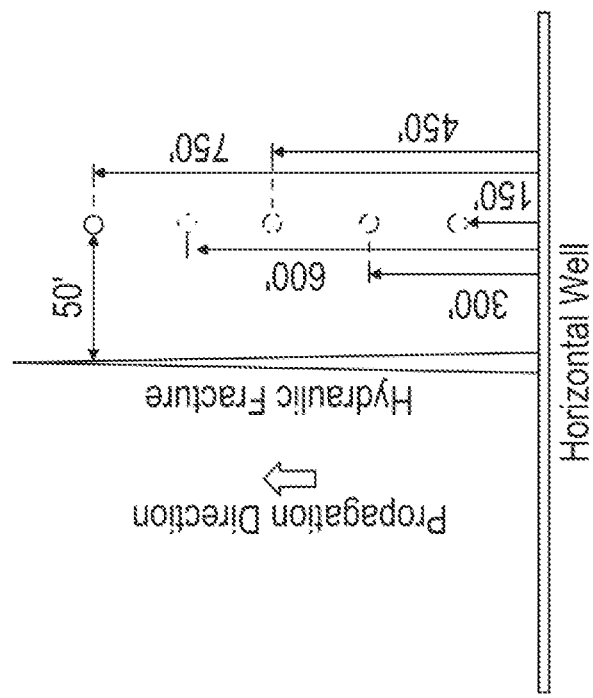

FIG. 2B shows a set of numerically simulated poroelastic pressure response curves to fracture propagation and closure, at multiple locations in the reservoir. FIG. 2A illustrate the hydraulic fracture and observation points corresponding to the curves. The fracture dimensions at the end of propagation are 775 ft (half-length) by 160 ft (height). As the fracture tip approaches the observation point, a decrease in pressure is observed resulting from tensile stresses. As the fracture continues to propagate, we see that the squeezing effect will produce an increase in pressure along observation points (150 ft, 300 ft, 450 ft, 600 ft, 750 ft from where the fracture initiates). After the well is shut-in at the end of the fracturing stage, poroelastic pressure declines due to leak-off and closure of the hydraulic fracture.

Downhole Configurations for Measuring Poroelastic Pressure Response

Figure 3:
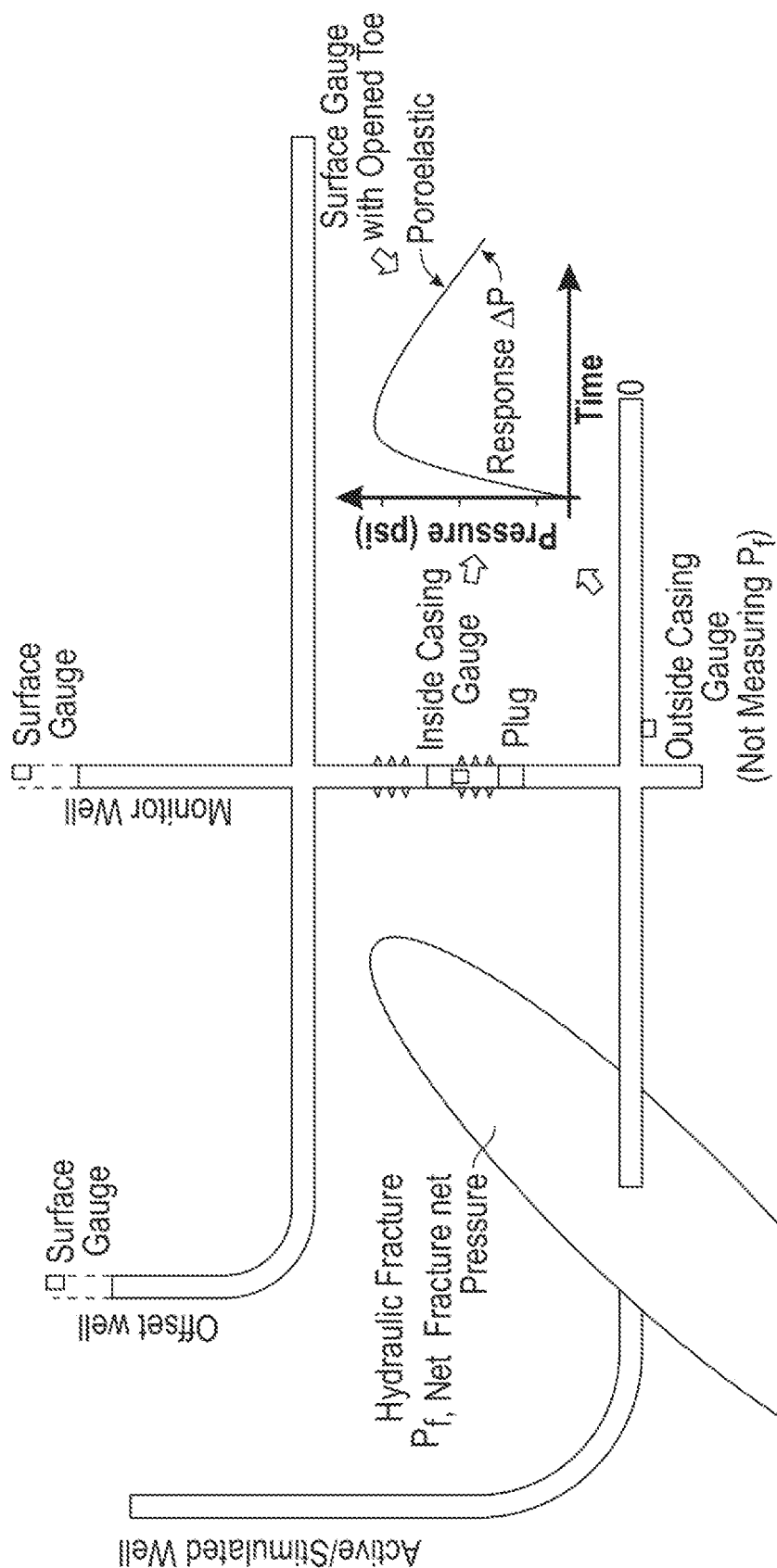
FIG. 3 illustrates an example of multiple well configuration during hydraulic fracturing.

FIG. 3 illustrates a common hydraulic fracturing setup that includes an active/stimulated well, offset well, and monitor well. As shown, a pressure gauge can be installed at the surface in the offset well and/or monitor well (not shown). The downhole well configurations of FIGS. 4A-4D, FIG. 5, and FIG. 6 can be viewed within the context of FIG. 3.

Figure 4A:
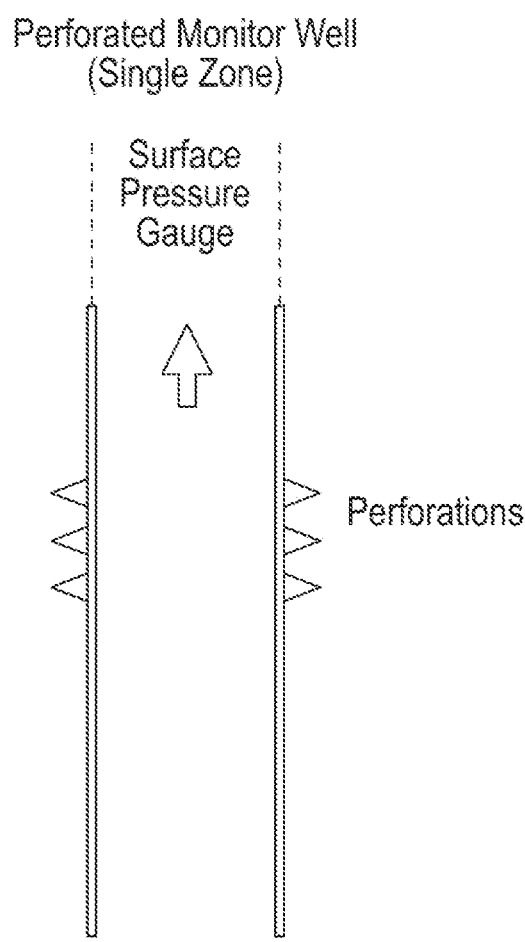
FIGS. 4A-4D illustrates downhole monitor vertical well configurations suitable for measuring poroelastic pressure response according to one or more embodiments.
Figure 4B:
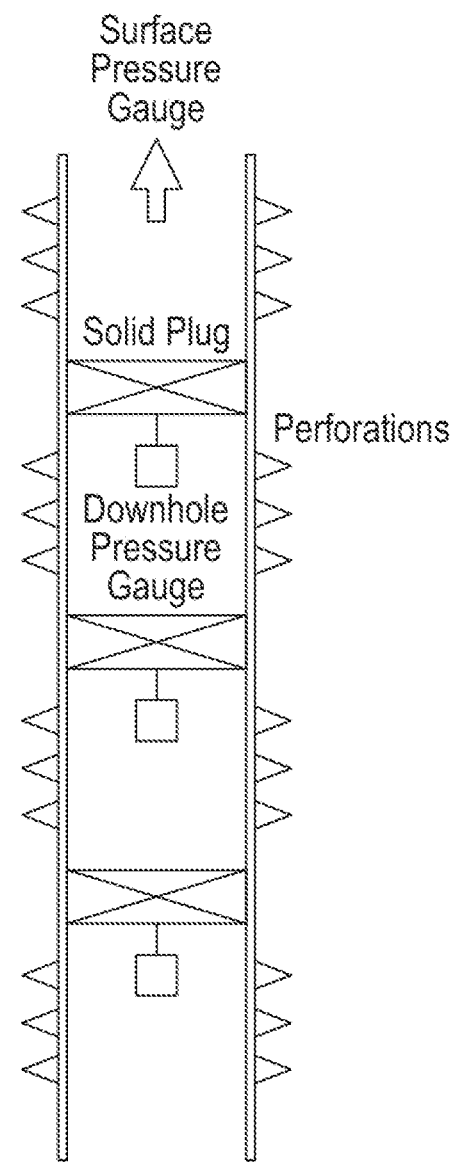
Figure 4C:
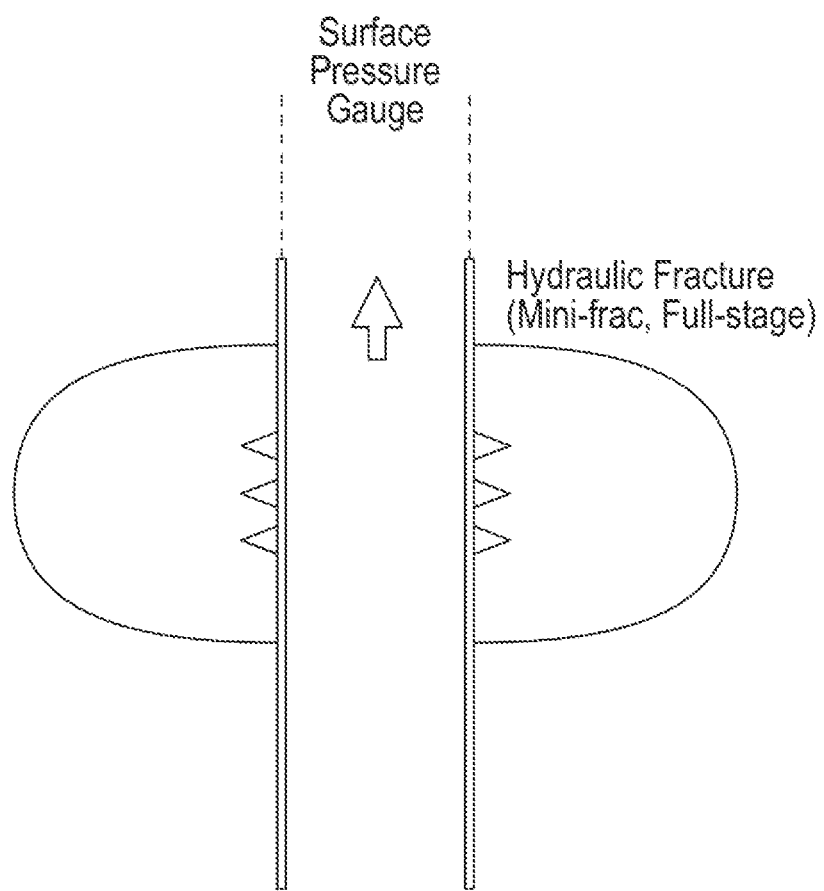
Figure 4D:
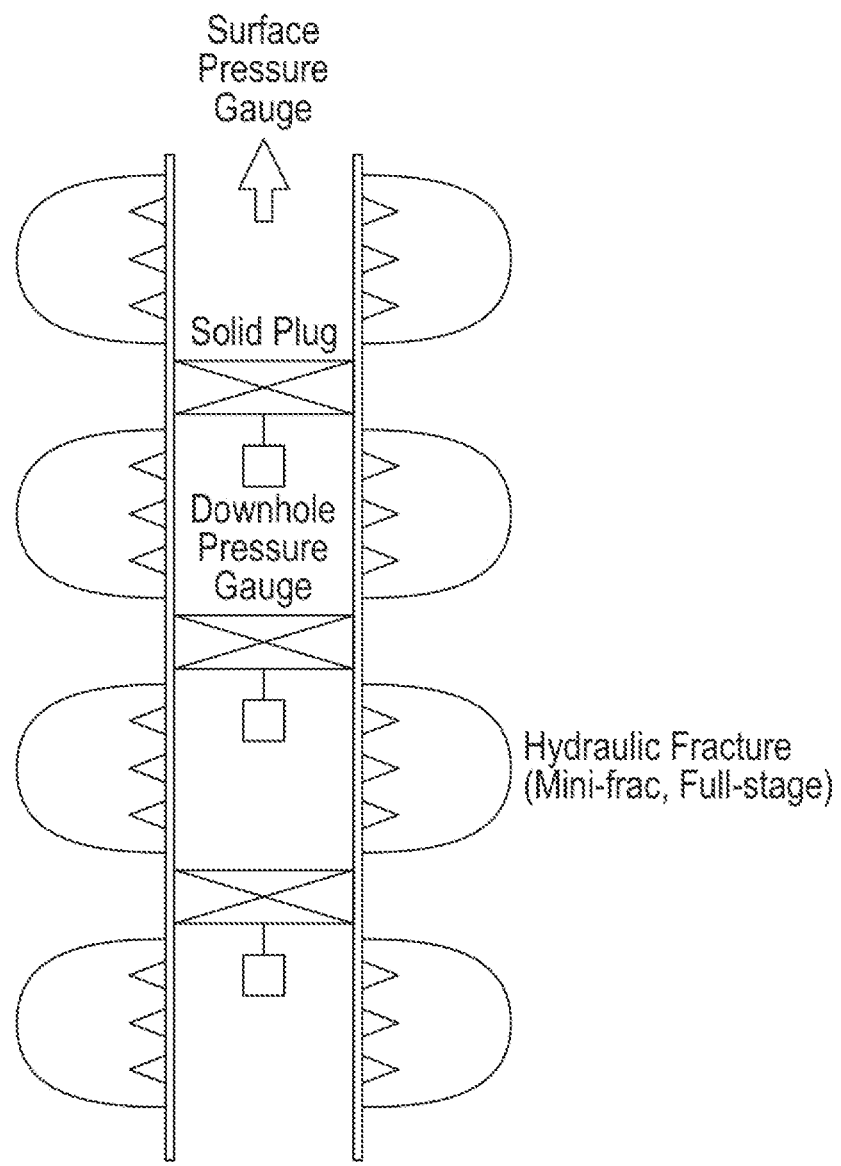

FIGS. 4A-4D illustrate different vertical well configurations that allow measurement of poroelastic pressure response through or in a monitor well. In these scenarios, the hydraulic fractures were generated in a nearby active well. FIG. 4A shows a single zone configuration of a perforated monitor well (unstimulated). As shown, a pressure gauge can be installed at the surface to measure poroelastic pressure response through the perforations. FIG. 4B shows a multi-zone configuration of a perforated monitor well (unstimulated). As shown, each zone has been sealed with a solid plug. This allows pressure gauges to be installed at various locations (e.g., surface, downhole within each zone, etc.) and locally measure poroelastic pressure response. FIG. 4C shows a single zone configuration of a stimulated monitor well. FIG. 4D shows a multi-zone configuration of a stimulated monitor well. In both of these configurations the poroelastic pressure response is measured through the monitor well's hydraulic fractures and perforations.

Figure 5:
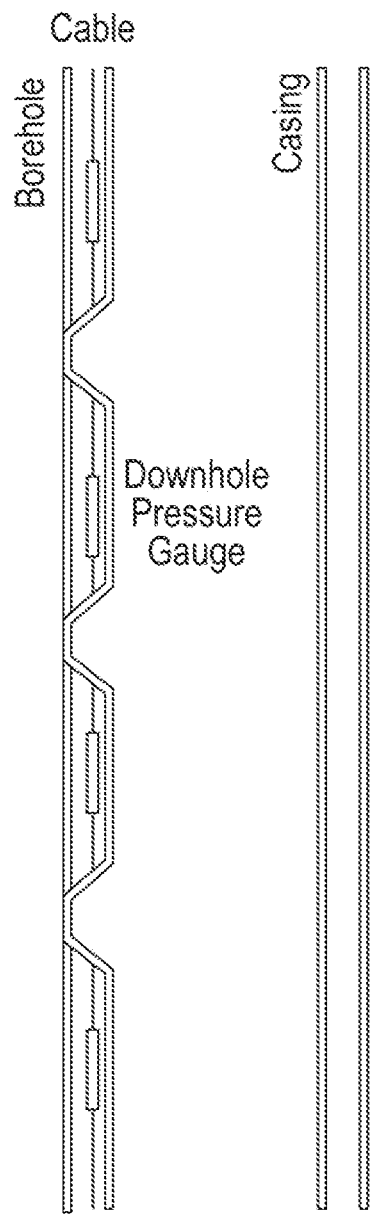
FIG. 5 illustrates downhole well configuration suitable for measuring poroelastic pressure response in which the pressure gauge is installed outside of the casing according to one or more embodiments.

FIG. 5 illustrates another vertical well measurement configuration. Here the pressure gauge is installed outside of the casing and can measure poroelastic pressure response through the porous rock formation.

Figure 6A:
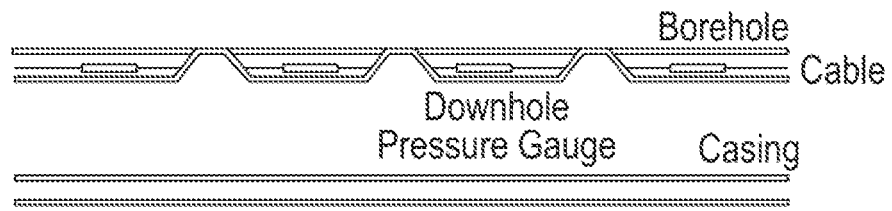
FIGS. 6A-6C illustrate horizontal well configurations suitable for measuring poroelastic pressure response according to one or more embodiments.
Figure 6B:
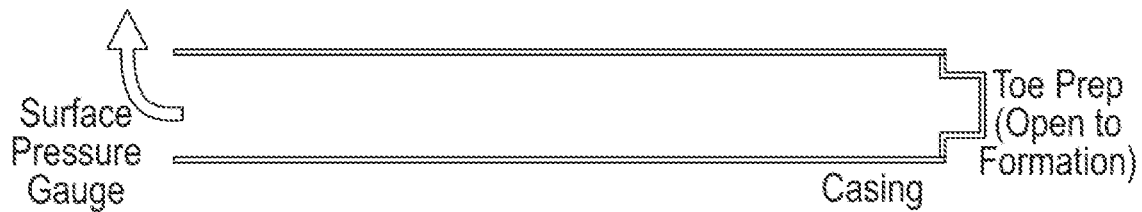
Figure 6C:
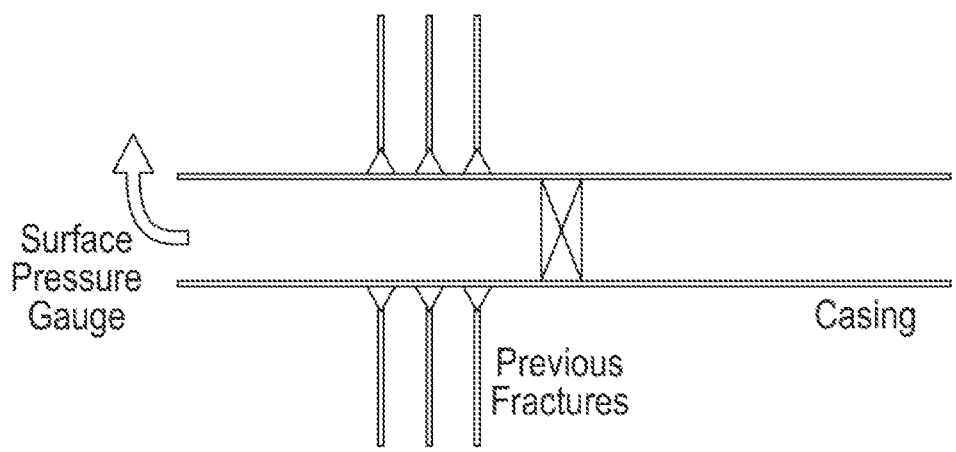

FIG. 6A-6C illustrate different horizontal well configurations. FIG. 6A shows pressure gauges installed outside of the casing at multiple reservoir locations. FIG. 6B shows poroelastic pressure measurements taken at the surface through the toe prep. FIG. 6C shows how pressure measurement can be taken at the surface through a fracture stage.

Utilizing Poroelastic Pressure Response in Real-Time

The present invention automates processing of active/offset well poroelastic pressure data by extracting its essential characteristics (e.g., time-lag, magnitude, slope) and accelerating its interpretation to provide a real-time interpreted map of each fracturing stage. The interpretations can include estimates of physical characteristics such as length, height, orientation, fracture asymmetry, residual width from proppant, and the like. These estimates can be based on a database or library of previously studied poroelastic pressure response ("pressure signatures"). In some embodiments, the database will include a searchable library of simulated or modeled pressure signatures (e.g., FIG. 2). In some embodiments, the database may include full or partial pressure signatures. In some embodiments, the database also includes pressure signatures obtained from field data (e.g, microseismic monitoring, distributed acoustic/temperature sensing, tiltmeter monitoring, fluid and proppant tracers, production logs, etc.). A user can query the database based on any one or combination of the essential characteristics (i.e., time-lag, magnitude, slope, etc.) to find a match. The process is analogous to finding a fingerprint match where several key features of the measured poroelastic pressure response is compared against a database of poroelastic pressure responses to find a match.

Combining the automated processing of acquired poroelastic pressure data with corresponding completion design characteristics allows optimization of completion design by means of machine learning techniques. Low-cost nature of the data and negligible impact on field operations means this technology may be applied on virtually all multi-pad wells. With the assistance of data analysis techniques, poroelastic pressure data may be processed in real time to provide an immediate assessment of the SRV, thus enabling decisions "on the fly" and even testing of several completion designs on a single well or pad.

Thus, the present invention provides a quick feedback mechanism for understanding geometry of induced fractures and its relationship to completion designs. This allows engineers to make changes to fracturing design (e.g., rate, proppant concentration, volume) on the fly and optimize completion in real time. Affordable, real-time, systematic fracture monitoring enabled by physics-informed data analytics and/or machine learning would considerably reduce learning time and allow faster convergence to optimum development scenarios.

Figure 7:
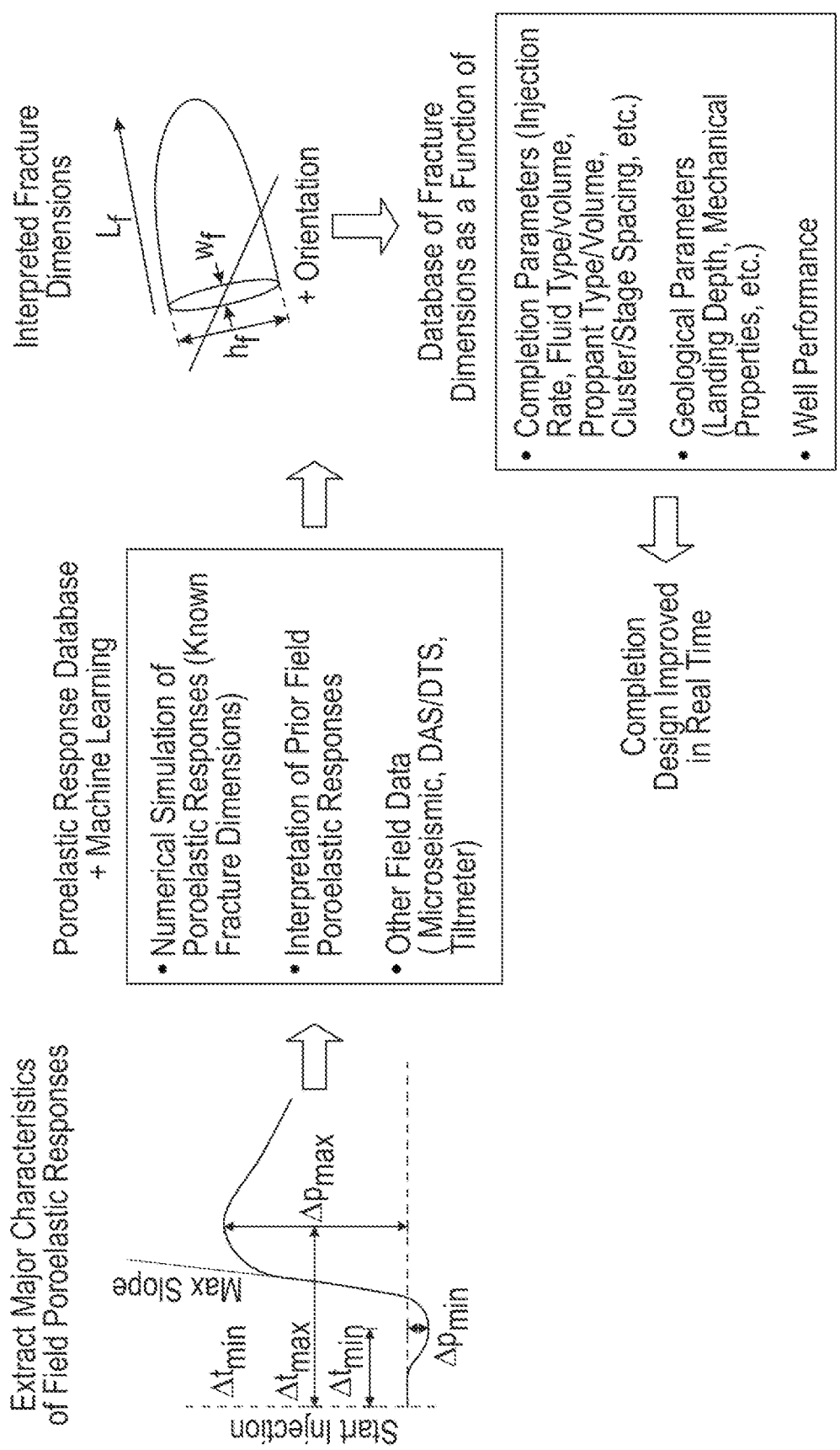
FIG. 7 illustrates a workflow for one or more embodiments of the present invention.

According to one or more embodiments, FIG. 7 illustrates a real-time workflow of fracture mapping and completion optimization based on interpretation of poroelastic pressure responses during hydraulic stimulation of a field. Referring to FIG. 7, the first step of the workflow involves extracting essential characteristics of the reservoir or field from the acquired poroelastic pressure responses (pressure versus time). These essential characteristics can be obtained by measuring the poroelastic pressure response after stimulation has begun. Some of these characteristics include elapsed time to reach maximum pressure ($\Delta t_{max}$), elapsed time to reach minimum pressure ($\Delta t_{min}$), maximum deviation in poroelastic pressure ($\Delta p_{max}$), minimum deviation in poroelastic pressure ($\Delta p_{min}$), and maximum slope (max $\Delta p/\Delta t$).

The poroelastic response database can include results from numerical simulations of poroelastic response of known fracture dimension, interpretation of prior field poroelastic responses, and other field fracture diagnostic data. The database can be queried using any of the essential characteristics, fracture dimension or dimensions, or even the shape of the poroelastic response curve. Integration of the poroelastic response database with machine learning capabilities (e.g., neural networks) can improve accuracy of fracture dimension predictions.

Once a match has been identified, dimensions (length, height, width, orientation, etc.) of the stimulated fractures can be estimated. Moreover, the database can be augmented or tagged with additional parameters such as best completion design parameters (injection rate, fluid type/volume, proppant type/volume, cluster/stage spacing, etc.) and geological parameters (landing depth, mechanical properties, etc.) and well performance.

With this information in hand, a completion engineer can query the database to obtain not only fracture dimensions but suggested completion parameters while considering factors such as geological parameters and well performance. Thus, the completion design is improved in real-time.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A method for characterizing a subterranean formation during a hydraulic fracturing operation comprising:
   a) injecting a fluid into an active well of the subterranean formation at a pressure sufficient to induce one or more hydraulic fractures;
   b) measuring, via a pressure sensor, a poroelastic pressure response caused by the inducing of the one or more hydraulic fractures, wherein the pressure sensor is in at least partial hydraulic isolation with the one or more hydraulic fractures;
   c) extracting one or more essential characteristics of said poroelastic pressure response;
   d) identifying a pressure signature based on said one or more essential characteristics;
   e) comparing the pressure signature to a database of pressure signatures to identify a match
   wherein said database of pressure signatures is augmented with additional parameters for completion design selected from one or more of injection rate, fluid type, fluid volume, proppant type, proppant volume, cluster spacing, and stage spacing; and
   f) interpreting the pressure signature in real-time to provide an immediate assessment of one or more hydraulic fracture dimensions.

2. The method of claim 1, wherein the hydraulic fracturing operation is a multi-zone hydraulic fracturing operation.

3. The method of claim 1, wherein the pressure sensor is installed at the surface or in the active well.

4. The method of claim 3, wherein the active well is divided into multiple zones by a well plug.

5. The method of claim 4, wherein at least one of the multiple zones is hydraulically isolated.

6. The method of claim 4, wherein the pressure sensor is installed inside a zone of the multi-zone zones.

7. The method of claim 1, wherein the pressure sensor is installed outside of a casing in the active well.

8. The method of claim 1, wherein the poroelastic pressure response is measured through an open toe of the active well.

9. The method of claim 1, wherein the pressure sensor is a pressure gauge.

10. The method of claim 1, wherein the pressure sensor is conveyed through casing or tubing, suspended at wellhead, or installed permanently or temporarily.

11. A method for characterizing a subterranean formation during a hydraulic fracturing operation comprising:
   a) injecting a fluid into the subterranean formation to induce one or more hydraulic fractures;
   b) measuring a poroelastic pressure response, via a pressure sensor, through a monitor well, wherein the poroelastic pressure response is caused by inducing of the one or more hydraulic fractures;
   c) extracting one or more essential characteristics of said poroelastic pressure response;
   d) identifying a pressure signature based on said one or more essential characteristics;
   e) comparing the pressure signature to a database of pressure signatures to identify a match
   wherein said database of pressure signatures is augmented with additional parameters for completion design selected from one or more of injection rate, fluid type, fluid volume, proppant type, proppant volume, cluster spacing, and stage spacing; and
   f) interpreting the pressure signature in real-time to provide an immediate assessment of one or more hydraulic fracture dimensions.

12. The method of claim 11, wherein the hydraulic fracturing operation is a multi-zone hydraulic fracturing operation.

13. The method of claim 11, wherein the pressure sensor is installed at the surface or in the monitor well.

14. The method of claim 11, wherein the monitor well is divided into multiple zones.

15. The method of claim 14, wherein at least one of the multiple zones is hydraulically isolated.

16. The method of claim 14, wherein the pressure sensor is installed inside a zone of the multi-zone zones.

17. The method of claim 11, wherein the pressure sensor is installed outside of a casing in the monitor well.

18. The method of claim 11, wherein the poroelastic pressure response is measured through an open toe of the monitor well.

19. The method of claim 11, wherein the pressure sensor is a pressure gauge.

20. The method of claim 11, wherein the pressure sensor is conveyed through casing or tubing, suspended at wellhead, or installed permanently or temporarily.

* * * * *